Sept. 8, 1959 R. M. COHEN ET AL 2,903,630
SEMICONDUCTOR DEVICES
Filed Sept. 21, 1956 2 Sheets-Sheet 1

INVENTORS
ROBERT M. COHEN &
REINHARD E. RIST
BY
J. C. Whittaker
ATTORNEY

INVENTORS
ROBERT M. COHEN &
REINHARD E. RIST
BY J. C. Whittaker
ATTORNEY

United States Patent Office 2,903,630
Patented Sept. 8, 1959

2,903,630

SEMICONDUCTOR DEVICES

Robert M. Cohen, Belleville, and Reinhard E. Rist, Millington, N.J., assignors to Radio Corporation of America, a corporation of Delaware Application September 21, 1956, Serial No. 611,205

7 Claims. (Cl. 317—235)

This invention relates to improved semiconductor devices; more particularly, it relates to improved semiconductor devices having low interelectrode capacitance.

It is known that semiconductor devices which contain at least two electrodes have an interelectrode capacitance in addition to the internal capacitance of the device. For example, in transistors, one of the important electrical parameters is the electrostatic feedback capacitance between the collector lead and the base lead, which is known as interelectrode capacitance and symbolized as $C_{bc}$. The internal capacitance of the transistor is written as $C_{b'c}$, while the electrostatic feedback capacitance between the emitter and the base is designated as $C_{b'e}$. When such a transistor is placed in a circuit, the total feedback capacitance of the transistor as "seen" by the circuit is approximately the sum of the internal capacitance $C_{b'c}$ and the interelectrode capacitance $C_{bc}$. The interelectrode capacitance of a device, as defined above, depends on the lead spacing, the dielectric constant and thickness of the stem material, and the lead length. It is usually lower than the internal capacitance. In some commercial alloy-junction transistors the interelectrode capacitance may be as much as one-third the internal capacitance. Transistors are now being designed with very low internal capacitance, so that the interelectrode capacitance becomes a significant proportion of the total capacitance of the unit.

High capacitance is undesirable in a semiconductor device for several reasons: First, high capacitance introduces an uncontrolled variable which results in units with non-uniform electrical characteristics; second, high capacitance makes the tuning of the input circuit affect the tuning of the output circuit; third, it adversely affects the performance of wide-band amplifiers where the device capacitance is effectively in parallel with the output capacitance across the output load; fourth, it affects the high frequency gain of devices such as transistors in a complex manner which depends on the band width of the amplifier, the signal frequency, and the degree of stability desired. Perhaps most important, high capacitance adversely affects the maximum frequency at which the device can be used as an amplifier.

Most semiconductor devices are enclosed in a case which is usually made of metal and is insulated from the electrically active portion of the device. The potential of such a case is frequently floating. It is often advantageous that the potential of the case be fixed. In some devices the potential of the case is fixed by connecting it to one of the active elements of the unit, usually the collector. This solution is not desirable in high frequency devices because it actually adds to the feedback capacitance and the interelectrode capacitance, producing the drawbacks and disadvantages mentioned above. A preferable way of fixing the potential of the case is to ground it.

It is therefore an object of this invention to provide improved semiconductor devices having low total electrostatic feedback capacitance.

Another object of this invention is to provide improved semiconductor devices having low interelectrode capacitance.

A further object of this invention is to provide improved semiconductor devices having a grounded case.

These and other objects and advantages of the invention are accomplished by inserting an additional lead or shield or strip between any two electrode leads and particularly between the base lead and one or more of the remaining leads of a semi-conductor device. The additional lead is grounded, and this reduces considerably the interelectrode capacitance of the device. The additional electrode may also be connected to the case of the device, and thus ground the case as well as reduce the total capacitance of the device.

The invention will be described in greater detail with reference to the accompanying drawing, in which Figure 1 is an equivalent one generator circuit for a transistor.

Figure 10A:
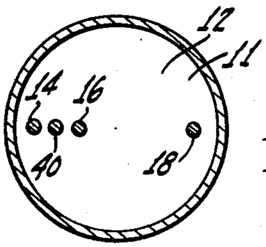
Figure 10B:
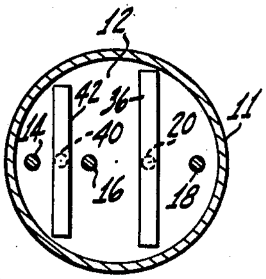
Figure 10C:
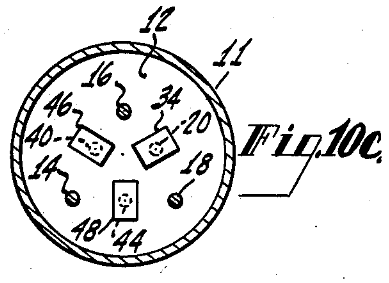

Figures 10*a*, 10*b*, and 10*c* are schematic plan views of additional forms of this invention.

Similar reference characters are applied to similar elements throughout the drawings.

Figure 1:
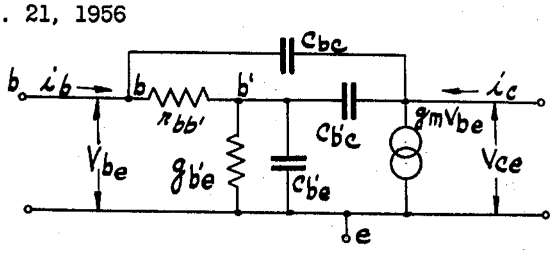

Referring to Figure 1 of the drawing, a transistor may be represented by the equivalent circuit as shown, having a single constant current generator. This type of equivalent circuit is used in the derivation of hybrid-$\pi$ parameters. For an explanation and discussion of hybrid-$\pi$ parameters and this equivalent circuit, see L. J. Giacoletto, "Study of P-N-P Alloy-Junction Transistors From D.C. Through Medium Frequency," RCA Review, volume 15, No. 4, December 1954, pp. 506–562; see also L. J. Giacoletto, "Terminology and Equations For Linear Active Four-Terminal Networks Including Transistors," RCA Review, volume 14, No. 1, March 1953, pp. 28–46. The circuit shown in Figure 1 indicates the total capacitance of the device is approximately the sum of $C_{bc}$ and $C_{b'c}$, but not exactly the sum because the interelectrode capacitance $C_{bc}$ is connected across a resistance $R_{bb'}$, while the internal capacitance $C_{b'c}$ is not connected across a resistance. The conductance between the base and the emitter is designated as $g_{b'e}$, while the intrinsic transconductance of the unit is symbolized as *gm*. An important figure of merit for high frequency performance is the frequency at which the power amplification is reduced to unity. This figure of merit or frequency is calculated from the equation $$f=\frac{1}{4\pi}\sqrt{\frac{gm}{(R_{bb'})(C_{bc}+C_{b'c})(C_{b'e})}}$$

The equivalent circuit indicates that decreasing the interelectrode capacitance increases the frequency at which power amplification is unity. This effect is more important when the internal capacitance $C_{b'c}$ is not too much larger than the interelectrode capacitance $C_{bc}$. If $C_{b'c}$ is several orders of magnitude larger than $C_{bc}$, then the diminution of the interelectrode capacitance $C_{bc}$ does not produce any significant change in the total capacitance of the unit, or in the other electrical parameters such as the frequency for unity power amplification.

Figure 2:
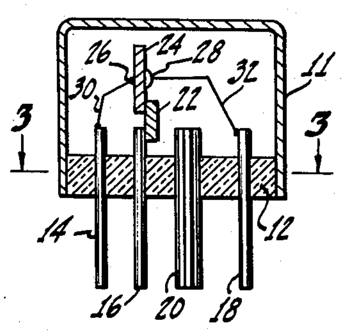
Figure 2 is a schematic cross-sectional view of a first embodiment of this invention.
Figure 3:
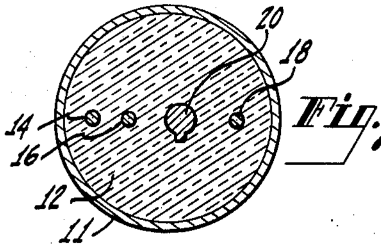
Figure 3 is a section taken along the line 3—3 of Figure 2.

Referring to Figure 2 of the drawing, one embodiment of the invention, in which the total electrostatic feedback capacitance of the semiconductor device is reduced, comprises a triode type transistor having an outer metal case 11, an insulating stem portion 12, an emitter lead 14, a base lead 16 supporting a base tab 22 ohmically connected to a semiconductor wafer 24 having an emitter electrode 26 and a collector electrode 28, a collector lead 18, a connecting wire 30 between the emitter lead 14 and the emitter electrode 26, a connecting wire 32 between the collector lead 18 and the collector electrode 28, with an additional lead 20 between the base lead 16 and the collector lead 18. As explained above, the insertion of the additional lead 20 reduces the interelectrode capacitance between the base lead 16 and the collector lead 18, thereby reducing the total capacitance of the device. The positioning of the unit in a socket may be facilitated if desired by utilizing a thicker wire for the additional lead 20 than is used for the other leads, or by keying the additional lead 20 as shown in Figure 3. It will be understood that the description in terms of a triode type transistor is by way of example only, and not as a limitation, since this invention is equally applicable to other types of semiconductor devices, including phototransistors, diodes, tetrodes, and units in which two or more devices are enclosed in a single case.

Figure 3 is a sectional view of the device shown in Figure 2. The case 11 may conveniently be made of a metal, for example cold rolled steel or brass. The insulating stem 12 may, for example, be made of glass.

Figure 4:
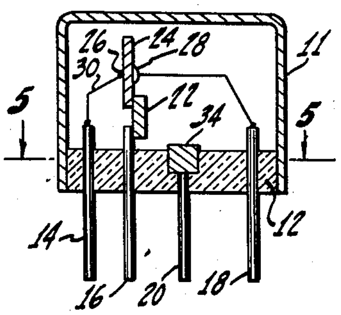
Figure 4 is a schematic cross-sectional view of a second embodiment of this invention.

For most purposes the insertion in the insulating stem of an additional lead which is of the same size as the other leads of the device is sufficient to reduce the interelectrode capacitance to a satisfactory value. However, if additional shielding is desired, another embodiment of this invention may be used as shown in Figure 4. The additional lead 20 is connected to a metal strip 34. In the embodiment shown, the metal strip 34 is entirely within the insulating stem 12. This form may be modified by having the metal strip extend partly above the insulating stem, or extend through the entire thickness of the insulated stem.

Figure 5:
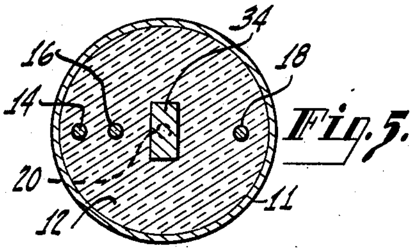
Figure 5 is a section taken along the line 5—5 of Figure 4.

Figure 5 is a sectional view of the device shown in Figure 4. The metal strip 34 may for example be made of copper, or bronze, or brass.

Figure 6:
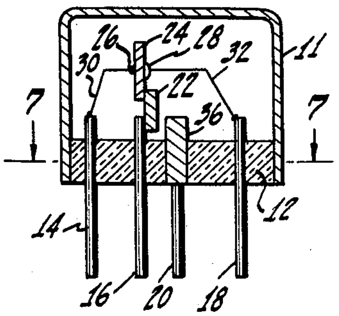
Figure 6 is a schematic cross-sectional view of a third form of this invention.
Figure 7:
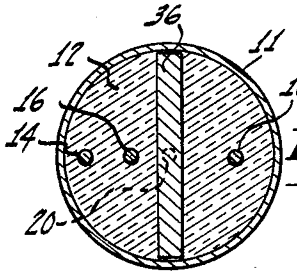
Figure 7 is a section taken along the line 7—7 of Figure 6.

Referring to Figure 6, another form of the invention is shown which may be utilized if more complete shielding is desired. In this form of the invention the additional lead 20 is connected to a metal plate 36 which extends across the entire internal diameter of the device, as as shown by Figure 7, which is a sectional view of the unit.

Figure 8:
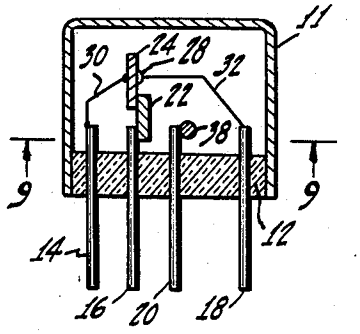
Figure 8 is a schematic cross-sectional view of a fourth embodiment of this invention.

Referring to Figure 8 of the drawing, another form of this invention is illustrated in which an additional advantage is obtained. Most semiconductor devices are enclosed in a case which is usually made of metal and is electrically insulated from the semiconductor crystal and the electrode leads, for example by a glass stem. In such devices the potential of the case floats. It is frequently desirable that the case potential be fixed, preferably by grounding the case. In this embodiment of the invention the metal case 11 is grounded by inserting a metal connection 38 from the additional lead 20 to the case 11. This form of the invention combines the advantage of reducing the base-collector interelectrode capacitance with the advantage of fixing the device at ground potential.

Figure 9:
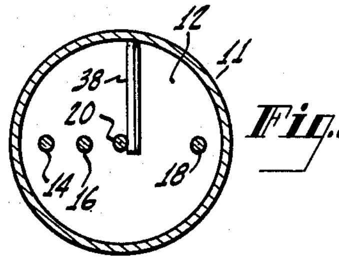
Figure 9 is a section taken along the line 9—9 of Figure 8.

Figure 9 is a section taken along the line 9—9 of Figure 8, showing the disposition of the metal connection 38 between the additional lead 20 and the metal case 11. The connection from the additional lead to the case may be made in several ways. For example, a pin or strip of metal 38 may be welded or soldered at one end to the additional lead 20 and at the other end to the metal case 11. A more convenient method of making the connection is by using a longer wire as the additional lead 20, bending this wire at right angles until it touches the case 11, and then welding or soldering the wire to the case. This method requires only one operation to make the connection.

Referring to Figure 10*a*, another modification of this invention is shown having reduced interelectrode capacitance between the emitter lead and the base lead. In this form of the invention an additional lead 40 is inserted between the emitter lead 14 and the base lead 16. If more complete shielding is desired, the additional lead 40 may terminate in a metal strip or plate (not shown). The effect of this shielding is significant in the types of transistors which have a low internal capacitance $C_{b'e}$ between the base and the emitter.

Referring to Figure 10*b*, another modification of this invention shields both the emitter and collector electrode leads from the base lead. This embodiment has one additional lead 20 terminating in a metal plate 36 between the base lead 16 and the collector lead 18. A second additional lead 40 terminates in a metal plate 42 between the base lead 16 and the emitter lead 14. In this manner it is possible to simultaneously diminish the collector-base interelectrode capacitance and the emitter-base interelectrode capacitance.

Referring to Figure 10*c*, another embodiment is shown having shielding between each pair of electrode leads. In this modification the emitter lead 14, the base lead 16, and the collector lead 18 are positioned at the vertices of a triangle. One additional lead 20 terminates in a metal strip 34 between the base lead 16 and the collector lead 18. A second additional lead 40 terminates in a metal strip 46 between the base lead 16 and the emitter lead 14. A third additional lead 44 terminates in a metal strip 48 between the emitter lead 14 and the collector lead 18.

It will be understood that the invention is equally applicable to all types of transistors, including point contact, surface alloyed, grown junction, surface barrier, and drift transistors. It will also be understood that the invention is equally suitable for NPN and PNP devices, and to devices in which the semiconductor is silicon or a compound such as indium phosphide, gallium arsenide, or cadmium telluride.

The advantages obtained by utilizing this invention may be seen from the following figures. By way of illustration, the figures refer to a PNP germanium diffused base drift transistor. In a typical unit of this type, with base and collector leads five-sixteenths inches long, operating at an ambient temperature of 25° C., the internal capacitance $C_{b'c}$ of the unit was 1.7 $\mu\mu$f. while the interelectrode capacitance $C_{bc}$ was 0.5 $\mu\mu$f. The total capacitance of the unit as "seen" by the circuit was approximately 2.2 $\mu\mu$f. Utilizing this invention, an additional lead was inserted between the collector and base leads. When this additional lead was grounded, the interelectrode capacitance $C_{bc}$ was reduced to 0.1 $\mu\mu$f., and the total capacitance of the unit to approximately 1.8 $\mu\mu$f. The power gain of another typical junction triode transistor when operating at 40 megacycles was 9 db. An additional lead was then inserted between the collector and base leads, in accordance with this invention. The power gain was thereby increased to 14 db. In addition, a substantial reduction of interaction between the tuning of the input circuit and the tuning of the output circuit was observed.

There have thus been described improved semiconductor devices having reduced interelectrode capacitance, diminished total capacitance, as well as cases fixed at ground potential.

What is claimed is:

1. A semiconductor device comprising a body of semiconducting material, a rectifying electrode and a base electrode on said body, leads connected to said electrodes, and an additional floating lead disposed between said electrode leads.

2. A semiconductor device comprising a body of semiconducting material, emitter and collector rectifying electrodes and a base electrode on said body, and an additional floating lead, not connected to any electrode, disposed between two of said electrode leads.

3. A semiconductor device comprising a metal case, a semiconductor body mounted within said case, said body having emitter, collector, and base electrodes thereupon, leads connected to each of said electrodes, and an additional lead adapted to be grounded connected to said case and disposed between said base electrode and one of the other two electrodes.

4. A transistor comprising a monocrystalline semiconductive body having successive regions of different conductivity types separated by rectifying barriers, leads attached to each said region, and an additional floating lead between two of said first mentioned leads.

5. A transistor comprising a metal case, an insulating stem portion within said case, a semiconductive monocrystalline body mounted within said case on said stem portion, said body having an emitter region, base region and collector region, leads attached to each said region and extending out of said case through said stem portion, a first additional lead adapted to be grounded extending from said stem portion between said emitter lead and said base lead, and a second additional lead adapted to be grounded extending from said stem portion between said base lead and said collector lead.

6. A transistor comprising a metal case, an insulating stem portion within said case, a monocrystalline semiconductive body mounted within said case on said stem portion, said body having an emitter region, base region and collector region, each said region having a lead attached, each said lead extending out of said case through said stem portion, a first additional lead adapted to be grounded extending from said stem portion between said emitter lead and said base lead, a second additional lead adapted to be grounded extending from said stem portion between said base lead and said collector lead, a third additional lead adapted to be grounded extending from said stem portion between said emitter lead and said collector lead, each said additional lead terminating in a metal plate within said stem portion.

7. A transistor comprising a metal case, an insulating stem portion within said case, a monocrystalline semiconductive body mounted within said case on said stem portion, said body having an emitter region and base region and collector region, each said region having a lead attached, each said lead extending out of said case through said stem portion, a first additional lead adapted to be grounded extending from said stem portion between said emitter lead and said base lead, a second additional lead adapted to be grounded extending from said stem portion between said base lead and said collector lead, a third additional lead adapted to be grounded extending from said stem portion between said emitter lead and said collector lead, one of said additional leads being connected to said case, whereby the electrostatic capacitance of said transistor is reduced and the said metal case is maintained at ground potential when said additional leads are grounded.

References Cited in the file of this patent

UNITED STATES PATENTS

| | | |
|---|---|---|
| 2,400,011 | Liebmann | May 7, 1946 |
| 2,762,956 | Ingraham | Sept. 11, 1956 |
| 2,809,332 | Sherwood | Oct. 8, 1957 |
| 2,825,014 | Willemse | Feb. 25, 1958 |